US012573532B2

(12) United States Patent
Magyar et al.

(10) Patent No.: US 12,573,532 B2
(45) Date of Patent: Mar. 10, 2026

(54) SUPERINDUCTOR-BASED REMOTE ENTANGLEMENT COUPLER

(71) Applicant: THE BOEING COMPANY, Arlington, VA (US)

(72) Inventors: Rudolph J. Magyar, Fulton, MD (US); Mark E. Nowakowski, Long Beach, CA (US); Ian M. Dayton, Middle River, MD (US); Colin W. Shea, West Friendship, MD (US)

(73) Assignee: The Boeing Company, Arlington, VA (US)

( * ) Notice: Subject to any disclaimer, the term of this patent is extended or adjusted under 35 U.S.C. 154(b) by 0 days.

(21) Appl. No.: 18/444,264

(22) Filed: Feb. 16, 2024

(65) Prior Publication Data

US 2025/0266196 A1 Aug. 21, 2025

(51) Int. Cl.
*H03K 17/92* (2006.01)
*H01F 6/00* (2006.01)
*H01F 38/14* (2006.01)

(52) U.S. Cl.
CPC .............. *H01F 6/00* (2013.01); *H01F 38/14* (2013.01); *H03K 17/92* (2013.01)

(58) Field of Classification Search
CPC .................................................... H03K 17/92
USPC ........................................................ 327/528
See application file for complete search history.

(56) References Cited

PUBLICATIONS

Kafri., D., et al., "Tunable Inductive Coupling of Superconducting Qubits in the Strongly Nonlinear Regime", Physical Review A, vol. 95(5), May 1, 2017, XP093283279, ISSN:2469-9926, DOI:10.1103/PhysRevA.95.052333. (Year: 2017).*
Pan et al., "Resonant Exchange Operation in Triple-Quantum-Dot Qubits for Spin-Photon Transduction", Quantum Sci. Technol. 5, 034005 (2020).
Wang et al., Deterministic entanglement of photons in two superconducting microwave resonators, Phys. Rev. Lett. 106, 060401 (2011).
Bialczak., R.C., et al., "Fast tunable coupler for superconducting qubits", Physical review letters, Feb. 11, 2011, p. 060501, XP055416788, United States DOI: 10.1103/PhysRevLett.106.060501 Retrieved from the Internet: URL: https://web.physics.ucsb.edu/~martinis group/papers/Bialczak2010.pdf [retrieved on Jun. 3, 2025].
Campbell., D.L., et al., "Modular Tunable Coupler for Superconducting Circuits", Physical Review Applied, vol. 19 (6), Jun. 1, 2023, XP093283282, ISSN: 2331-7019, DOI: 10.1103/PhysRevApplied. 19.064043 * Abstract, II. Double transmon coupler model and operation, pp. 1-17.
Extended European Search Report for Application No. EP25155979. 5, mailed on Jun. 20, 2025, 08 pages.

(Continued)

*Primary Examiner* — Tomi Skibinski
(74) *Attorney, Agent, or Firm* — Harrity & Harrity, LLP

(57) ABSTRACT

The present disclosure provides a method of remote entanglement of alternating current (AC) dipoles in one aspect, the method including: supplying a bias current to a tunable superinductor, inductively coupling a current from a first AC dipole into the tunable superinductor, and inductively coupling an induced current from the tunable superinductor into a second AC dipole.

20 Claims, 3 Drawing Sheets

(56) References Cited

PUBLICATIONS

Harris., R., et al., "A Compound Josephson Junction Coupler for Flux Qubits With Minimal Crosstalk", Arxiv.Org, Cornell University Library, 201 Olin Library Cornell University Ithaca, NY 14853, Apr. 24, 2009, XP080321184, DOI:10.1103/PHYSREVB.80. 052506. pp. 1-5.

Kafri., D., et al., "Tunable Inductive Coupling of Superconducting Qubits in the Strongly Nonlinear Regime", Physical Review A, vol. 95(5), May 1, 2017, XP093283279, ISSN: 2469-9926, DOI:10. 1103/PhysRevA.95.052333.

* cited by examiner

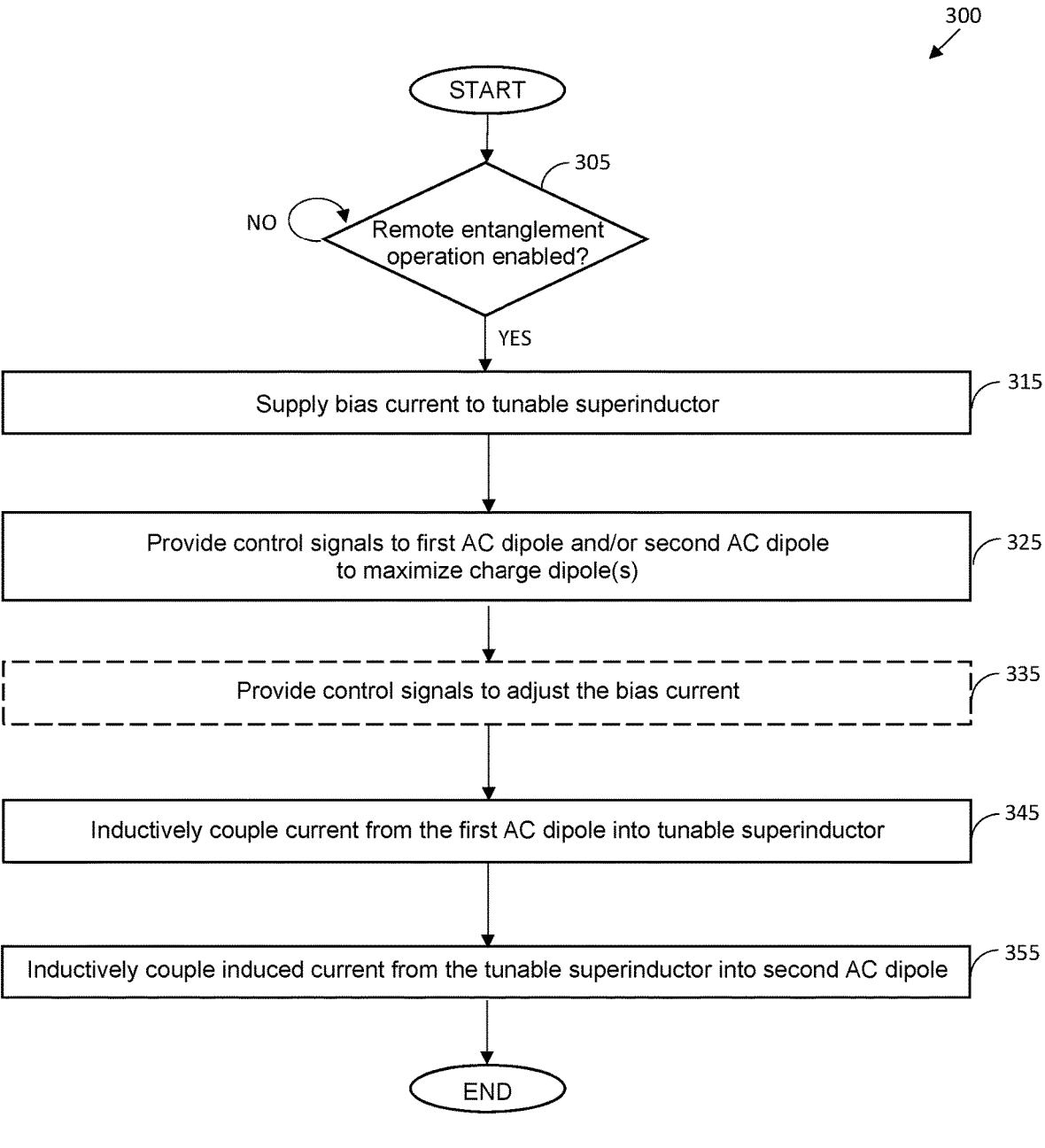

300

START

305

NO

Remote entanglement
operation enabled?

YES

Supply bias current to tunable superinductor — 315

Provide control signals to first AC dipole and/or second AC dipole
to maximize charge dipole(s) — 325

Provide control signals to adjust the bias current — 335

Inductively couple current from the first AC dipole into tunable superinductor — 345

Inductively couple induced current from the tunable superinductor into second AC dipole — 355

END

FIG. 3

SUPERINDUCTOR-BASED REMOTE ENTANGLEMENT COUPLER

GOVERNMENT LICENSE RIGHTS

This invention was made with United States Government support. The government has certain rights in the invention.

FIELD

Aspects of the present disclosure relate to quantum sensing, and more specifically, techniques for remote entanglement between quantum systems using superconducting components.

BACKGROUND

Various technologies are used to provide alternating current (AC) dipoles, such as quantum dots and superconductors. Such quantum devices are capable of holding single electrons, which may be manipulated to perform a number of quantum computing functions.

One conventional solution for achieving remote entanglement of quantum devices relies primarily on superconducting cavity resonators. These resonators tend to be challenging to fabricate with a quality factor sufficient to achieve clean entanglement operations. Further, these resonators are unable to accurately tune their resonant frequency and modes. For example, to generate certain standing wave configurations, an electrode at the center is needed to enforce a node in the resonant waveform to maximize entanglement. Further, the operation of the resonators relies on transmission of single photons to carry the energy between the entangled quantum devices. Any external noise that is received from the environment or adjacent electronics is a dominant corrupting mode, which competes with a relatively weak coupling and can render the resonator inoperable, e.g., by decohering the quantum information.

SUMMARY

The present disclosure provides a method of remote entanglement of alternating current (AC) dipoles in one aspect, the method including: supplying a bias current to a tunable superinductor, inductively coupling a current from a first AC dipole into the tunable superinductor, and inductively coupling an induced current from the tunable superinductor into a second AC dipole.

In one aspect, in combination with any example method above or below, the method further includes providing control signals to one or both of the first AC dipole and the second AC dipole to maximize a charge dipole thereof.

In one aspect, in combination with any example method above or below, the tunable superinductor comprises: a superconducting quantum interference device (SQUID), and a direct current (DC) current source that supplies the bias current.

In one aspect, in combination with any example method above or below, a first mutual inductor couples the first AC dipole with a first port of the tunable superinductor, and a second mutual inductor couples the second AC dipole with a second port of the tunable superinductor.

In one aspect, in combination with any example method above or below, the tunable superinductor comprises: a first branch coupling the first mutual inductor with the second mutual inductor. The first branch comprises one or more Josephson junctions (JJs) coupled in series. The tunable superinductor further comprises a second branch coupling the first mutual inductor with the second mutual inductor. The second branch comprises the SQUID and the DC current source.

In one aspect, in combination with any example method above or below, the second branch further comprises a third mutual inductor having an input port coupled with the DC current source, and the SQUID comprises a first JJ coupled in parallel with a series coupling of a second JJ and an output port of the third mutual inductor.

In one aspect, in combination with any example method above or below, the second branch further comprises one or more JJs coupled in series with the SQUID.

The present disclosure provides a system in one aspect, the system including: a first alternating current (AC) dipole, a second AC charge dipole, and an entanglement circuit coupled with the first AC charge dipole and with the second AC charge dipole, the entanglement circuit comprising a tunable superinductor.

In one aspect, in combination with any example system above or below, the tunable superinductor comprises: a superconducting quantum interference device (SQUID), and a direct current (DC) current source.

In one aspect, in combination with any example system above or below, the system further including: a first mutual inductor coupled with the first AC charge dipole and with a first port of the entanglement circuit, and a second mutual inductor coupled with the second AC charge dipole and with a second port of the entanglement circuit.

In one aspect, in combination with any example system above or below, the tunable superinductor comprises: a first branch coupling the first mutual inductor with the second mutual inductor. The first branch comprises one or more Josephson junctions (JJs) coupled in series. The tunable superinductor further comprises a second branch coupling the first mutual inductor with the second mutual inductor. The second branch comprising the SQUID and the DC current source.

In one aspect, in combination with any example system above or below, the second branch further comprises a third mutual inductor having an input port coupled with the DC current source, and the SQUID comprises a first JJ coupled in parallel with a series coupling of a second JJ and an output port of the third mutual inductor.

In one aspect, in combination with any example system above or below, the second branch further comprises one or more JJs coupled in series with the SQUID.

In one aspect, in combination with any example system above or below, the DC current source is configured to supply a bias current to the input port, a value of the bias current selected to maximize a coupling between the first AC charge dipole and the second AC charge dipole.

The present disclosure provides an apparatus in one aspect, the apparatus including: a first port to couple with a first alternating current (AC) dipole, a second port to couple with a second AC dipole, and a tunable superinductor coupled with the first port and with the second port.

In one aspect, in combination with any example apparatus above or below, the tunable superinductor circuit comprises: a superconducting quantum interference device (SQUID), and a direct current (DC) current source.

In one aspect, in combination with any example apparatus above or below, the apparatus further comprises: a first mutual inductor coupled with the first AC charge dipole and with the first port, and a second mutual inductor coupled with the second AC charge dipole and with the second port.

In one aspect, in combination with any example apparatus above or below, the tunable superinductor comprises a first branch coupling the first mutual inductor with the second mutual inductor. The first branch comprises one or more Josephson junctions (JJs) coupled in series. The tunable superinductor further comprises a second branch coupling the first mutual inductor with the second mutual inductor. The second branch comprises the SQUID and the DC current source.

In one aspect, in combination with any example apparatus above or below, the second branch further comprises a third mutual inductor having an input port coupled with the DC current source, and the SQUID comprises a first JJ coupled in parallel with a series coupling of a second JJ and an output port of the third mutual inductor.

In one aspect, in combination with any example apparatus above or below, the second branch further comprises one or more JJs coupled in series with the SQUID.

BRIEF DESCRIPTION OF THE DRAWINGS

So that the manner in which the above recited features can be understood in detail, a more particular description, briefly summarized above, may be had by reference to example aspects, some of which are illustrated in the appended drawings.

FIG. 3 depicts an exemplary method of remote entanglement of alternating current (AC) dipoles, according to one or more aspects.

DETAILED DESCRIPTION

The present disclosure relates to techniques for high-precision, tunable, electrically-protected remote entanglement of alternating current (AC) dipoles. In some aspects, a method of remote entanglement comprises supplying a bias current to a tunable superinductor, inductively coupling a current from a first AC dipole into the tunable superinductor, and inductively coupling the current from the tunable superinductor into a second AC dipole. In some aspects, the tunable superinductor is based on a series of Josephson junctions that present a large and tunable inductance (and impedance) and strong coupling.

Use of the tunable superinductor allows for long range entanglement with superior tunability and greater isolation of the entangled quantum state than conventional solutions, such as cavity resonators in combination with current transmission line technologies. Beneficially, these high-precision, tunable, electrically-protected remote entanglement techniques support the further development of robust quantum sensing technologies, cryo-control electronics, and more capable entanglement swapping. The remote entanglement techniques described herein also improve fabrication uniformity.

In the current disclosure, reference is made to various aspects. However, it should be understood that the present disclosure is not limited to specific described aspects. Instead, any combination of the following features and elements, whether related to different aspects or not, is contemplated to implement and practice the teachings provided herein. Additionally, when elements of the aspects are described in the form of "at least one of A and B," it will be understood that aspects including element A exclusively, including element B exclusively, and including element A and B are each contemplated. Furthermore, although some aspects may achieve advantages over other possible solutions and/or over the prior art, whether or not a particular advantage is achieved by a given aspect is not limiting of the present disclosure. Thus, the aspects, features, aspects and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Figure 1:
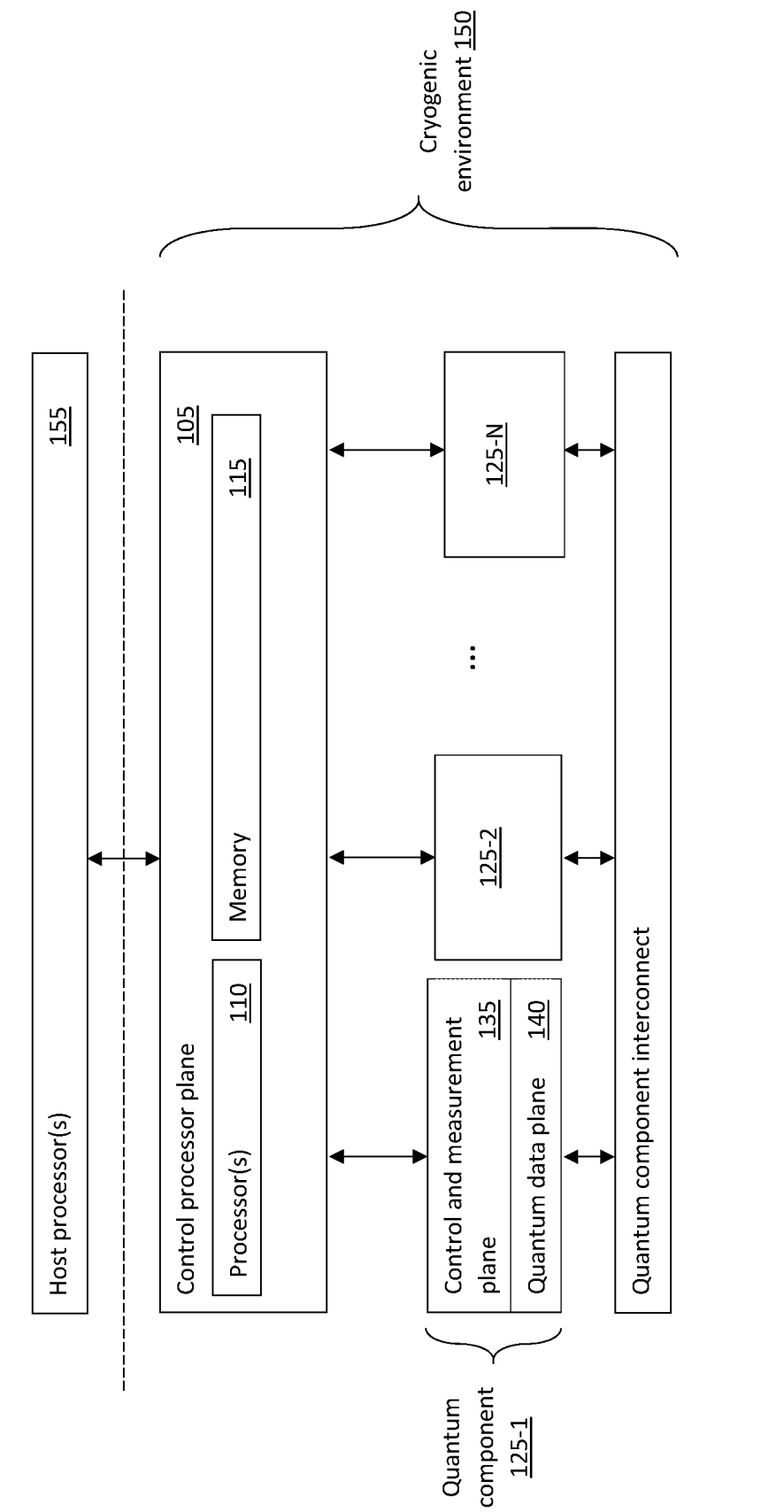
FIG. 1 depicts an exemplary quantum system, according to one or more aspects.

FIG. 1 depicts an exemplary quantum system 100, according to one or more aspects. The features depicted in the quantum system 100 may be used in conjunction with other aspects described herein. For example, the remote entanglement operation (described in greater detail below) may be achieved using one or more quantum systems 100.

The quantum system 100 comprises a plurality of quantum components 125-1, 125-2, . . . , 125-N, a quantum component interconnect 145, a control processor plane 105, and a host processor 155. As used herein, the plurality of quantum components 125-1, 125-2, . . . , 125-N refer to any suitable number of units that are physically and/or logically distinct from each other, e.g., a plurality of quantum chips. While the quantum system 100 of FIG. 1 generally represents a large-scale quantum system, other architectures of the quantum system 100 are also contemplated, e.g., a quantum system 100 having only a single "component".

Each of the quantum components 125-1, 125-2, . . . , 125-N comprises a respective quantum data plane 140 and a control and measurement plane 135, and is communicatively coupled with the control processor plane 105. The quantum components 125-1, 125-2, . . . , 125-N are communicatively coupled with each other by the quantum component interconnect 145. In some aspects, the quantum data plane 140 comprises hardware that physically forms one or more qubits, as well as the structures used to support and/or retain the one or more qubits. In some aspects, the quantum data plane 140 forms one or more AC dipoles. The qubits may have any suitable form, such as quantum dots, superconducting circuits, and so forth. In other aspects, the quantum data plane 140 comprises a quantized quantum device operable as a sensor. In yet other aspects, the quantum data plane 140 comprises a repeater (or quantum information amplifier) that is used in a quantum network. Thus, implementations of the entanglement circuit 205 of FIG. 2, discussed below, may be used in quantum processing environments, as well as outside of quantum processing environments.

In some aspects, the quantum data plane 140 comprises further circuitry that operates to measure the states of the one or more qubits, and to manipulate the states of the one or more qubits when carrying out operations. For example, gate operations may be performed using control signals that alter the Hamiltonian (i.e., a description of the state) of the one or more qubits. In some aspects, quantum information in the one or more qubits may be stored, changed, and/or read by transmitting microwave photons at the one or more qubits.

The control and measurement plane 135 comprises hardware that receives digital control signals from the control processor plane 105, and translates the digital control signals into analog (or wave) control signals that are read and executed in the quantum data plane 140 to perform quantum operations on the one or more qubits. In some aspects, the control and measurement plane 135 comprises one or more waveguides supporting transmission (and, in some cases, shielding) of signals to and/or from the quantum data plane 140. For example, in a quantum data plane 140 having the qubits formed in superconducting circuits, the control signals may be transmitted to the qubits through microwave waveguides extending through a dilution refrigerator or other cooling device.

The control and measurement plane 135 further comprises hardware that receives analog outputs from the quantum data plane 140 (representing measurements of qubits), and converts the analog outputs into digital signals that are transmitted to the control processor plane 105. The hardware included in the control and measurement plane 135 may include additional shielding to mitigate the effects of environmental noise on the analog outputs received from the quantum data plane 140.

The control processor plane 105 implements a quantum algorithm or sequence of quantum operations, and provides corresponding instructions to be implemented in the control and measurement plane 135. The host processor 155 is communicatively coupled with the control processor plane 105, and provides digital signal(s) that implement the quantum algorithm in the control processor plane 105 and/or interact with the quantum algorithm.

In some aspects, the quantum algorithm is implemented using quantum circuits, each of which represents a computing routine having a series of quantum operations on the qubits of the quantum data plane 140. In some aspects, the quantum algorithm may be implemented using development tools and libraries. In some aspects, the quantum algorithm comprises a sequence of gate operations and measurements that are performed in the control and measurement plane 135.

As shown, the control processor plane 105 is implemented as one or more processors 110 and a memory 115. The one or more processors 110 are any electronic circuitry, including, but not limited to one or a combination of microprocessors, microcontrollers, application-specific integrated circuits (ASIC), application-specific instruction set processors (ASIP), and/or state machines, that is communicatively coupled to the memory 115 and controls the operation of the control processor plane 105.

The one or more processors 110 may include other hardware that operates software to control and process information. The one or more processors 110 executes software stored in the memory 115 to perform any of the functions described herein. The one or more processors 110 control the operation and administration of the computing device 105 by processing information (e.g., information received from input devices and/or communicatively coupled electronic devices).

The memory 115 may store, either permanently or temporarily, data, operational software, or other information for the one or more processors 110. The memory 115 may include any one or a combination of volatile or non-volatile local or remote devices suitable for storing information. For example, the memory 115 may include random access memory (RAM), read only memory (ROM), magnetic storage devices, optical storage devices, or any other suitable information storage device or a combination of these devices. The software represents any suitable set of instructions, logic, or code embodied in a computer-readable storage medium such as the memory 115. In particular embodiments, the software may include an application executable by the one or more processors 110 to perform one or more of the functions described herein.

In some aspects, some or all of the components of the quantum system 100 operates within a cryogenic environment 150. As shown, the hardware of the control processor plane 105, the plurality of quantum components 125-1, 125-2, . . . , 125-N, and the quantum component interconnect 145 are disposed within the cryogenic environment 150, and the one or more host processors 155 are disposed outside the cryogenic environment 150. In some aspects, the one or more host processors 155 are considered "classical" processors including any electronic circuitry, including, but not limited to one or a combination of microprocessors, microcontrollers, application-specific integrated circuits (ASIC), application-specific instruction set processors (ASIP), and/or state machines.

In some aspects, a cryogenic cooling system using liquefied gases such as liquid nitrogen, liquid hydrogen, or liquid helium may be in fluid communication with the cryogenic environment 150 to maintain a temperature of about 120 K (−153° C.) or less. In some aspects, the cryogenic environment 150 has a temperature that is very close to absolute zero (0 K; −273.15° C.) as superconductivity and the associated quantum characteristics are most pronounced at these temperatures. However, the cryogenic environment 150 may have any alternate suitable temperature to ensure superconductivity (e.g., based on the critical temperature of the superconductor material(s)).

Figure 2:
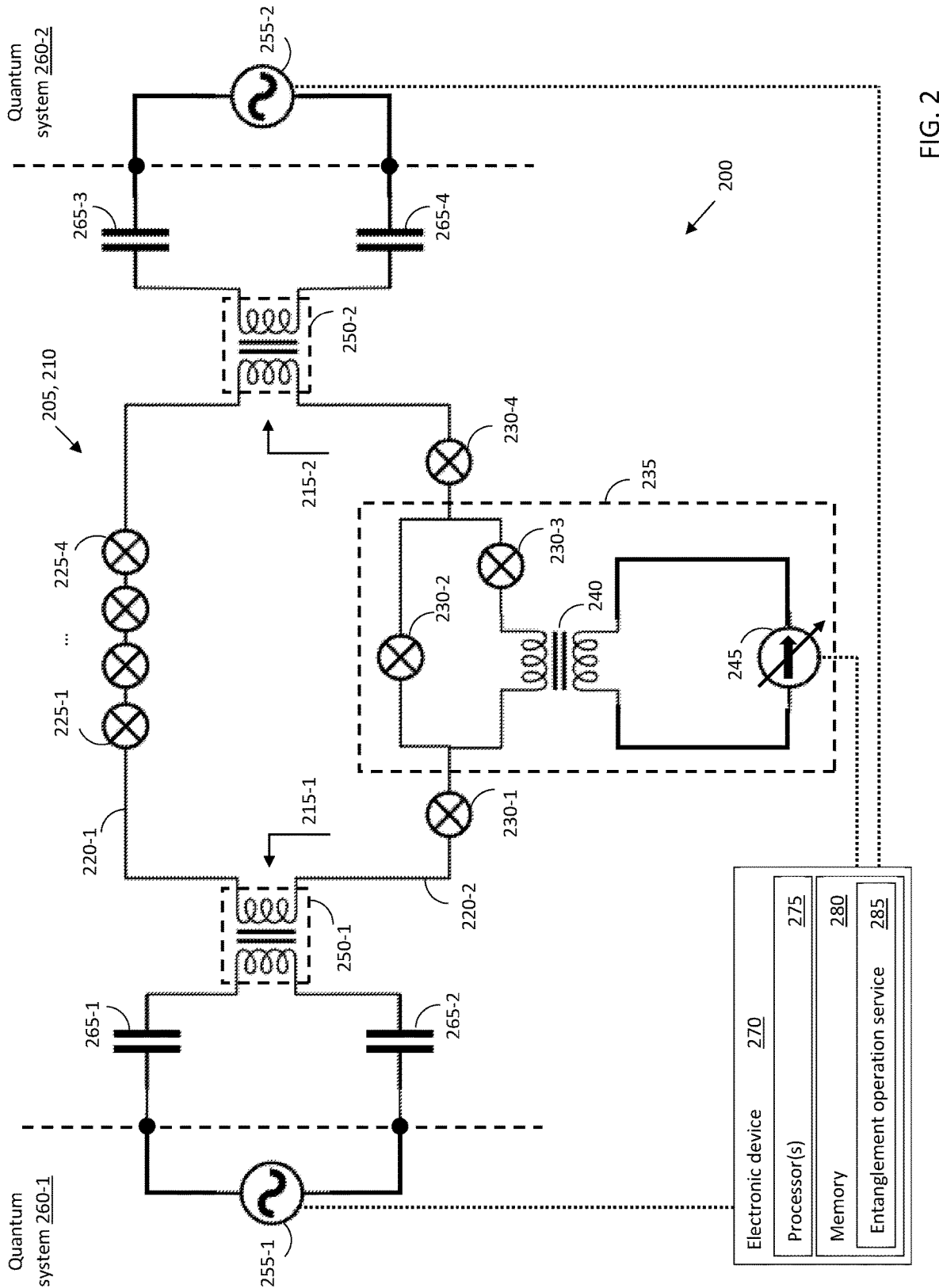
FIG. 2 depicts a system having an exemplary entanglement circuit, according to one or more aspects.

FIG. 2 depicts a system 200 having an exemplary entanglement circuit 205, according to one or more aspects. The entanglement circuit 205 may be alternately described as a superinductor-based resonator. The system 200 may be used in conjunction with other aspects described herein. For example, the various components of the system 200 may be implemented within one or more quantum components 125-1, 125-2, . . . , 125-N of the quantum system 100.

The system comprises an entanglement circuit 205 coupled with a first quantum system 260-1 and a second quantum system 260-2. Each of the quantum systems 260-1, 260-2 comprises a respective AC dipole 255-1, 255-2 that may be implemented using any suitable technologies providing oscillating charge representing quantum coherent states, such as quantum dots or superconducting circuits. For example, the oscillating charge may represent quantum fluctuations that are associated with a stationary state of a quantum circuit. In some aspects, the AC dipoles 255-1, 255-2 are included in a same quantum data plane 140 of a particular quantum component 125-1, 125-2, . . . , 125-N. In other aspects, the AC dipoles 255-1, 255-2 are included in quantum data planes 140 of different quantum components 125-1, 125-2, . . . , 125-N of the quantum system 100.

Thus, in some aspects, the quantum systems 260-1, 260-1 may represent one or more instances of the quantum system 100. However, the entanglement circuit 205 enables coherent quantum information transfer between the AC dipoles 255-1, 255-2 regardless of their implementation. As discussed above, some example implementations of the AC dipoles 255-1, 255-2 include a set of one or more qubits, a quantized quantum device operable as a sensor, and a repeater (or quantum information amplifier) that is used in a quantum network. For example, when implemented in a quantum network repeater, the AC dipoles 255-1, 255-2 may represent qudits of N-level states of the quantum systems 260-1, 260-2, supporting quantum information swapping and entanglement between chips or other circuitry.

The entanglement circuit 205 comprises a first port 215-1 that couples with the first quantum system 260-1, and a second port 215-2 that couples with the second quantum system 260-2. As shown, the nodes of the AC dipole 255-1 are coupled with a first port of a first mutual inductor 250-1 through respective capacitors 265-1, 265-2. The first mutual inductor 250-1 and the capacitors 265-1, 265-2 may have any suitable implementation. The second port of the first mutual inductor 250-1 is coupled with the first port 215-1 of the entanglement circuit 205. Each of the first port and the second port of the first mutual inductor 250-1 may be operated as an input port or as an output port depending on the configuration of the system 200.

The nodes of the AC dipole 255-2 are coupled with a first port of a second mutual inductor 250-2 through respective capacitors 265-3, 265-4. The second mutual inductor 250-2 and the capacitors 265-3, 265-4 may have any suitable implementation. The second port of the second mutual inductor 250-2 is coupled with the second port 215-2 of the entanglement circuit 205. Each of the first port and the second port of the second mutual inductor 250-1 may be operated as an input port or as an output port depending on the configuration of the system 200.

The entanglement circuit 205 further comprises a tunable superinductor 210 disposed between the first port 215-1 and the second port 215-2. In some aspects, the tunable superinductor 210 comprises a first branch 220-1 coupling the first mutual inductor 250-1 with the second mutual inductor 250-2 (i.e., coupling a first pair of nodes), and a second branch 220-2 coupling the first mutual inductor 250-1 with the second mutual inductor 250-2 (i.e., coupling a second pair of nodes). The first branch 220-1 comprises one or more Josephson junctions (JJs) 225-1, . . . , 225-4 that are coupled in series with each other. While four (4) JJs 225-1, . . . , 225-4 are illustrated, other numbers of JJs in the first branch 220-1 are also contemplated.

In some aspects, the second branch 220-2 comprises a superconducting quantum interference device (SQUID) 235 and a DC current source 245, which enables tuning of the tunable superinductor 210 by controlling the amount of bias current that is supplied by the DC current source 245. Stated another way, controlling the amount of the bias current enables the SQUID 235 to modulate the inductance of the loop of the tunable superinductor 210. In some aspects, and as discussed below, an electronic device 270 comprises an entanglement operation service 285 that provides control signals that are used to select a bias current of the DC current source 245. Controlling the amount of bias current supplied to the SQUID 235 allows the effective modes of the tunable superinductor 210 to be controlled. For example, the tunable superinductor 210 may be operated in a ring mode for a first value of the bias current, and may be operated in a linear mode for a second value of the bias current (e.g., zero DC current). The DC current source 245 may have any suitable implementation, such as a MOSFET constant-current source.

In some aspects, the second branch 220-2 (more specifically, the SQUID 235) further comprises a third mutual inductor 240 having an input port coupled with the DC current source 245. The SQUID 235 comprises a first JJ 230-2 that is coupled in parallel with a series coupling of a second JJ 230-3 and an output port of the third mutual inductor 240. The second branch 220-2 further comprises one or more JJs 230-1, 230-4 that are coupled in series with the SQUID 235. While four (4) JJs 230-1, . . . , 230-4 are illustrated, other numbers of JJs in the second branch 220-1 are also contemplated. Further, in some aspects, the number of JJs included in the first branch 220-1 may differ from the number of JJs included in the second branch 220-2. Thus, in some aspects, the tunable superinductor 210 is formed as a superinductor loop comprising the JJs 225-1, . . . , 225-4 of the first branch 220-1, portions of the mutual inductors 250-1, 250-2, and the JJs 230-1, 230-4 and SQUID 235 of the second branch 220-2.

Each of the JJs 225-1, . . . , 225-4, 230-1, . . . , 230-4 comprises a first superconductor section that is spaced apart from a second superconductor section by a weak link section. The first superconductor section and the second superconductor section may be formed of any suitable superconducting material(s). In some aspects, the weak link section comprises one of an insulating material, a non-superconducting metal material, and a physical constriction providing areas of reduced superconductivity. The weak link section has suitable dimensioning to support the quantum tunneling of electrons therethrough. Typically, the thickness of the weak link section may be on the order of tens of angstroms (Å), or on the order of several microns, depending on the composition of the weak link section.

The first superconductor section and the second superconductor section, when cooled to cryogenic temperatures in the cryogenic environment 150, are able to conduct electricity without providing any electrical resistance. The flow of a supercurrent, conducted through the JJ across the weak link section, is governed by quantum tunneling of Cooper pairs (i.e., pairs of electrons having opposite spins that are bound together at cryogenic temperatures).

In some aspects, the JJs 225-1, . . . , 225-4, 230-1, . . . , 230-4 may be implemented to have similar parameters (e.g., a same magnitude of dimensioning, critical current values, and so forth). For example, where the SQUID 235 is arranged in parallel, the JJs 225-1, . . . , 225-4, 230-1, . . . , 230-4 should have critical current values as close to each other as possible, as the current tuning ability of the SQUID 235 depends on this. In other cases where the SQUID 235 is arranged in series, it may be possible to trade off capacitance and desired spectral modes. In other aspects, some or all of the JJs 225-1, 225-4, 230-1, . . . , 230-4 may be implemented with differing parameters.

Collectively, the JJs 225-1, . . . , 225-4, 230-1, . . . , 230-4 of the tunable superinductor 210 effectively operate as a classical inductor having a large inductance (and large impedance), providing a stronger coupling between the quantum systems 260-1, 260-2. Thus, the tunable superinductor 210 supports a stronger entanglement between the AC dipoles 255-1, 255-2, as the large impedance provides a large coupling and mitigates induced noise during entanglement operations. Further, in some aspects, the various components of the system 205 may be coupled with each other using high quality connections (e.g., superconducting wire segments) that improve the coupling and entanglement between the AC dipoles 255-1, 255-2. By integrating the SQUID 235 in the tunable superinductor 210, the inductance of the tunable superinductor 210 may be precisely tuned, and the impedance and the resonant frequency of the entanglement circuit 205 may be better controlled.

The system 200 further comprises an electronic device 270. As used herein, an "electronic device" generally refers to any device having electronic circuitry that provides a processing or computing capability, and that implements logic and/or executes program code to perform various operations that collectively define the functionality of the electronic device. The functionality of the electronic device includes a communicative capability with one or more other electronic devices, e.g., when connected to a same network. An electronic device may be implemented with any suitable form factor, whether relatively static in nature (e.g., mainframe, computer terminal, server, kiosk, workstation) or mobile (e.g., laptop computer, tablet, handheld, smart phone, wearable device). The communicative capability between electronic devices may be achieved using any suitable techniques, such as conductive cabling, wireless transmission, optical transmission, and so forth. In some aspects, the electronic device 270 may be implemented outside of the cryogenic environment 150. In other aspects, the electronic device 270 may be implemented partly or fully within the cryogenic environment 150.

The electronic device 270 comprises one or more processors 275 and a memory 280. The one or more processors 275 are any electronic circuitry, including, but not limited to one or a combination of microprocessors, microcontrollers, application-specific integrated circuits (ASIC), application-specific instruction set processors (ASIP), and/or state machines, that is communicatively coupled to the memory 280 and controls the operation of the electronic device 270. The one or more processors 275 are not limited to a single processing device and may encompass multiple processing devices.

The one or more processors 275 may include other hardware that operates software to control and process information. In some aspects, the one or more processors 275 execute software stored in the memory 280 to perform any of the functions described herein. The one or more processors 275 control the operation and administration of the electronic device 270 by processing information (e.g., information received from input devices and/or communicatively coupled electronic devices).

The memory 280 may store, either permanently or temporarily, data, operational software, or other information for the one or more processors 275. The memory 280 may include any one or a combination of volatile or non-volatile local or remote devices suitable for storing information. For example, the memory 280 may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory 280, a disk, a CD, or a flash drive. In particular embodiments, the software may include an application executable by the one or more processors 275 to perform one or more of the functions described herein.

In this example, the memory 280 stores an entanglement operation service 285 that controls the remote entanglement of AC dipoles. In some aspects, the entanglement operation service 285 enables and/or disables the remote entanglement operation within the system 200, and/or controls one or more parameters defining the remote entanglement operation. As shown, the entanglement operation service 285 is coupled with the AC dipoles 255-1, 255-2 (or with the quantum systems 260-1, 260-2) and with the SQUID 235 (or with the tunable superinductor 210). In some aspects, the entanglement operation service 285 provides signals to control operation of the quantum devices 260-1, 260-2 to interact with the entanglement circuit 205. In some aspects, the signals cause the quantum devices 260-1, 260-2 to adiabatically change their quantum states to maximize the charge dipole for each of the AC dipoles 255-1, 255-2 (or AC charge dipole), that is, for the left-side plates of the capacitors 265-1, 265-2 and for the right-side plates of the capacitors 265-3, 265-4. In some aspects, the entanglement operation service 285 may further provide signals to control operation of the SQUID 235, e.g., by selecting or adjusting a bias current of the DC current source 245.

In some aspects, the inductance of the tunable superinductor 210 is controlled such that the quantum systems 260-1, 260-2 may be operated and developed independent of each other. When remote entanglement operation of the system 200 is desired, the quantum systems 260-1, 260-2 are controlled (e.g., by signals from the entanglement operation service 285) to have precisely timed (or synchronized) operations. The tunable superinductor 210 typically operates during the entirety of the remote entanglement operation. During the remote entanglement operation, one of the AC dipoles 255-1, 255-2 creates a current, which is inductively coupled into the tunable superinductor 210. The induced current in the tunable superinductor 210 is then inductively coupled into the other of the AC dipoles 255-1, 255-2 to achieve the remote entanglement.

The inductance presented by the tunable superinductor 210 may be further fine-tuned to maximize the entanglement operation. The fine-tuning operation tends to relax shape and size constraints that allows the system 200 to be more tolerant of any fabrication defects. For example, an AC line may be added to the SQUID 235 to support finer tuning of the tunable superinductor 210. Such an implementation may also be capable of turning off (or disabling) the tunable superinductor 210, as the inductance presented by the tunable superinductor 210 may be controlled to minimize or eliminate coupling between the AC dipoles 255-1, 255-2.

The entanglement circuit 205 having the tunable superinductor 210 provides a number of advantages relative to conventional strip-line resonator designs. First, the entanglement circuit 205 suppresses charge fluctuations and supports a greater quality factor The tunable superinductor 210 allows a greater impedance than the resistance quantum $$\left( e.g., Z > R_Q = \frac{\hbar}{(2e)^2} = 6.45\ k\Omega \right)$$

to be achieved, while presenting a lower capacitance than the strip-line resonator which increases uniformity of fabrication. Second, the entanglement circuit 205 improves dipole coupling and supports greater coupling between the AC dipoles 255-1, 255-2. This advantage is particularly useful for quantum remote sensing (e.g., using interferometry-based devices) using remote entanglement between a probe and a receiver, which enhances the capability to sense a remote target and transfer quantum information therewith. The coupling is often expected to be proportional to a square root of the impedance, which can be controlled by the choice of a critical current for the JJs 225-1, . . . , 225-4, 230-1, . . . , 230-4 and fine-tuned using the SQUID 235.

Another advantage provided by the system 200 is that the superconducting components of the system 200 may be fabricated from a different semiconductor fabrication process than the quantum devices. In some aspects, the entanglement circuit 205 may be formed in a first process, a semiconductor chip may be formed in a second process, and the entanglement circuit 205 may be bonded with the semiconductor chip in the final quantum device.

FIG. 3 depicts an exemplary method 300 of remote entanglement of alternating current (AC) dipoles, according to one or more aspects. The method 300 may be used in conjunction with other aspects described herein. For example, although certain blocks are described as being performed using the entanglement operation service 285, the method 300 may be performed using various components of the quantum system 100 and/or of the system 200 of FIG. 2.

The method 300 begins at block 305, where the entanglement operation service 285 determines whether remote entanglement operation is enabled in the system 200. If the remote entanglement operation is not enabled ("NO"), the method 300 repeats block 305, e.g., after a periodic delay. If the remote entanglement operation is enabled ("YES"), the method 300 proceeds from block 305 to block 315, a bias current is supplied to the tunable superinductor 210 of the system 200. In some aspects, the bias current is supplied to the SQUID 235 included in the branch 220-2 of the tunable superinductor 210. Supplying the bias current causes the entanglement circuit 205 to operate during the remote entanglement operation. In some aspects, block 315 is performed prior to block 305, such that the entanglement circuit 205 operates with a desired configuration prior to controlling the AC dipoles (connected to the entanglement circuit 205) to achieve remote entanglement.

The method 300 proceeds from block 315 to block 325, where the entanglement operation service 285 provides control signals to a first AC dipole 255-1 and/or to a second AC dipole 255-2 to maximize charge dipole(s) thereof. In some aspects, the signals cause a change to quantum states to maximize the charge dipole for the first AC dipole 255-1 and/or the second AC dipole 255-2. In an optional block 335, the entanglement operation service 285 provides control signals to adjust the bias current.

The method 300 proceeds from block 325 or optional block 335 to block 345, where a current is inductively coupled from the first AC dipole 255-1 into the tunable superinductor 210. Inductively coupling the current induces a current within the tunable superinductor 210. The method 300 then proceeds from block 345 to block 355, where the induced current is inductively coupled from the tunable superinductor into the second AC dipole 255-2. The method 300 ends following completion of the block 355.

As will be appreciated by one skilled in the art, aspects described herein may be embodied as a system, method or computer program product. Accordingly, aspects may take the form of an entirely hardware aspect, an entirely software aspect (including firmware, resident software, micro-code, etc.) or an aspect combining software and hardware aspects that may all generally be referred to herein as a "circuit," "module" or "system." Furthermore, aspects described herein may take the form of a computer program product embodied in one or more computer readable storage medium (s) having computer readable program code embodied thereon.

Program code embodied on a computer readable storage medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to aspects of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various aspects of the present disclosure. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order or out of order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

While the foregoing is directed to aspects of the present disclosure, other and further aspects of the disclosure may be devised without departing from the basic scope thereof, and the scope thereof is determined by the claims that follow.

What is claimed is:

1. A method of remote entanglement of alternating current (AC) dipoles, the method comprising:

supplying a bias current to a tunable superinductor;

13 inductively coupling a current from a first AC dipole into the tunable superinductor, wherein a first mutual inductor couples the first AC dipole with a first port of the tunable superinductor; and inductively coupling an induced current from the tunable superinductor into a second AC dipole, wherein a second mutual inductor couples the second AC dipole with a second port of the tunable superinductor, and wherein the tunable superinductor comprises:

a superconducting quantum interference device (SQUID);

a direct current (DC) current source that supplies the bias current;

a first branch coupling the first mutual inductor with the second mutual inductor, the first branch comprising one or more Josephson junctions (JJs) coupled in series; and a second branch coupling the first mutual inductor with the second mutual inductor, the second branch comprising the SQUID and the DC current source.

2. The method of claim 1, further comprising:

providing control signals to one or both of the first AC dipole and the second AC dipole to maximize a charge dipole thereof.

3. The method of claim 1, the second branch further comprising a third mutual inductor having an input port coupled with the DC current source, and the SQUID comprising a first JJ coupled in parallel with a series coupling of a second JJ and an output port of the third mutual inductor.

4. The method of claim 3, the second branch further comprising one or more JJs coupled in series with the SQUID.

5. The method of claim 1, wherein the tunable superinductor is configured to operate in at least one of a ring mode, or a linear mode.

6. The method of claim 5, wherein the tunable superinductor is configured to operate in the ring mode for a first value of the bias current, and wherein the tunable superinductor is configured to operate in the linear mode for a second value of the bias current.

7. The method of claim 1, wherein the tunable superinductor is configured to be tuned based on controlling an amount of the bias current.

8. A system comprising:

a first alternating current (AC) dipole;

a second AC charge dipole;

an entanglement circuit coupled with the first AC charge dipole and with the second AC charge dipole, the entanglement circuit comprising a tunable superinductor;

a first mutual inductor coupled with the first AC charge dipole and with a first port of the entanglement circuit; and a second mutual inductor coupled with the second AC charge dipole and with a second port of the entanglement circuit, wherein the tunable superinductor comprises:

a superconducting quantum interference device (SQUID);

a direct current (DC) current source;

a first branch coupling the first mutual inductor with the second mutual inductor, the first branch comprising one or more Josephson junctions (JJs) coupled in series; and a second branch coupling the first mutual inductor with the second mutual inductor, the second branch comprising the SQUID and the DC current source.

9. The system of claim 8, the second branch further comprising a third mutual inductor having an input port coupled with the DC current source, and the SQUID comprising a first JJ coupled in parallel with a series coupling of a second JJ and an output port of the third mutual inductor.

10. The system of claim 9, the second branch further comprising one or more JJs coupled in series with the SQUID.

11. The system of claim 9, wherein the DC current source is configured to supply a bias current to the input port, a value of the bias current selected to maximize a coupling between the first AC charge dipole and the second AC charge dipole.

12. The system of claim 8, wherein the tunable superinductor is configured to operate in at least one of a ring mode, or a linear mode.

13. The system of claim 12, wherein the tunable superinductor is configured to operate in the ring mode for a first value of the bias current, and wherein the tunable superinductor is configured to operate in the linear mode for a second value of the bias current.

14. The system of claim 8, wherein the tunable superinductor is configured to be tuned based on controlling an amount of the bias current.

15. An apparatus comprising:

a first port to couple with a first alternating current (AC) dipole;

a second port to couple with a second AC dipole;

a tunable superinductor coupled with the first port and with the second port;

a first mutual inductor coupled with the first AC charge dipole and with the first port; and a second mutual inductor coupled with the second AC charge dipole and with the second port, wherein the tunable superinductor comprises:

a superconducting quantum interference device (SQUID);

a direct current (DC) current source;

a first branch coupling the first mutual inductor with the second mutual inductor, the first branch comprising one or more Josephson junctions (JJs) coupled in series; and a second branch coupling the first mutual inductor with the second mutual inductor, the second branch comprising the SQUID and the DC current source.

16. The apparatus of claim 15, the second branch further comprising a third mutual inductor having an input port coupled with the DC current source, and the SQUID comprising a first JJ coupled in parallel with a series coupling of a second JJ and an output port of the third mutual inductor.

17. The apparatus of claim 16, the second branch further comprising one or more JJs coupled in series with the SQUID.

18. The apparatus of claim 15, wherein the tunable superinductor is configured to operate in at least one of a ring mode, or a linear mode.

19. The apparatus of claim 18, wherein the tunable superinductor is configured to operate in the ring mode for a first value of the bias current, and wherein the tunable superinductor is configured to operate in the linear mode for a second value of the bias current.

20. The apparatus of claim 15, wherein the tunable superinductor is configured to be tuned based on controlling an amount of the bias current.

\* \* \* \* \*